United States Patent [19]

Fowler

[11] 4,283,630
[45] Aug. 11, 1981

[54] IRRADIATED FILM

[75] Inventor: Stephen L. Fowler, Taylors, S.C.

[73] Assignee: W. R. Grace & Co., Duncan, S.C.

[21] Appl. No.: 43,402

[22] Filed: May 29, 1979

Related U.S. Application Data

[62] Division of Ser. No. 784,184, Apr. 4, 1977, Pat. No. 4,178,220.

[51] Int. Cl.³ .............................................. H01J 37/06
[52] U.S. Cl. ................................................. 250/492 B
[58] Field of Search ................ 250/492 R, 492 B, 398

[56] References Cited

U.S. PATENT DOCUMENTS

| | | | |
|---|---|---|---|
| 2,785,313 | 3/1957 | Trump | 250/492 B |
| 2,993,120 | 7/1961 | Emanuelson | 250/492 B |
| 4,178,220 | 12/1979 | Fowler | 250/492 B |

Primary Examiner—Bruce C. Anderson
Attorney, Agent, or Firm—John J. Toney; William D. Lee, Jr.; Joseph P. Harps

[57] ABSTRACT

Irradiated film having substantial uniformity in the radiation dosage profile is produced by irradiating the film within a trough having lateral deflection blocks disposed adjacent the film edges for deflecting electrons toward the surface of the trough bottom for further deflecting the electrons toward the film edge.

2 Claims, 4 Drawing Figures

IRRADIATED FILM

This is a division of Application Ser. No. 784,184, filed Apr. 4, 1977, now U.S. Pat. No. 4,178,220.

BACKGROUND OF THE INVENTION

The present invention relates to irradiated polyolefin film and more particularly to a process of irradiating polyolefin film to create substantially uniform dosage throughout the width of the film.

Polyolefins and particularly polyethylene have been widely used for various functions. A particular use of such material has been in the form of a film or sheet of material used in packaging. Such material is frequently oriented so as to be heat shrinkable around articles packaged therein.

In order to enhance the properties of polyolefins and particularly polyethylene, such materials are crosslinked by irradiation. An example of such an irradiation process is disclosed in U.S. Pat. No. 3,144,399 to Rainer et al. Such an irradiation process comprises subjecting the polymer to an irradiation dosage of about 1 to about 20 megarads.

In the process of producing oriented polyethylene film a tape of extruded material is subjected to such irradiation and is then heated and oriented by known techniques. The technique for so doing is described in U.S. Pat. No. 3,741,253 as it relates to the irradiation and orientation of a copolymer of ethylene and vinyl acetate.

A problem, however, of producing irradiated film is that for some reason the edge area of a film tends to be significantly less crosslinked than the central area of the film, i.e., for some reason the effective irradiation dosage at the film edge is less than the effective dosage within the central portion of the film. This obviously results in a film having non-uniform properties across the width thereof. A technique is disclosed in U.S. Pat. No. 2,993,120 for magnetically concentrating electrons around a thin film during the irradiation process. This process, however, while increasing the efficiency of electron irradiation, does not solve the problem of non-uniform dosages across the width of the film.

SUMMARY OF THE INVENTION

It is thus an object of this invention to provide a polyolefin film which has been irradiated to a dosage which is substantially more uniform across its width than was producible by prior art techniques.

It is a further object of this invention to provide a process for irradiating polyolefin film with electrons to a substantially uniform effective dosage across the width of the film.

It is a further object of this invention to provide an apparatus for irradiating film with electrons to a substantially uniform effective dosage across the width of the film.

These as well as other objects are accomplished by irradiating film within a trough having disposed adjacent the film edges electron deflectors effective for deflecting electrons toward the bottom of the trough and from there back toward the film edge.

DETAILED DESCRIPTION

Figure 1:
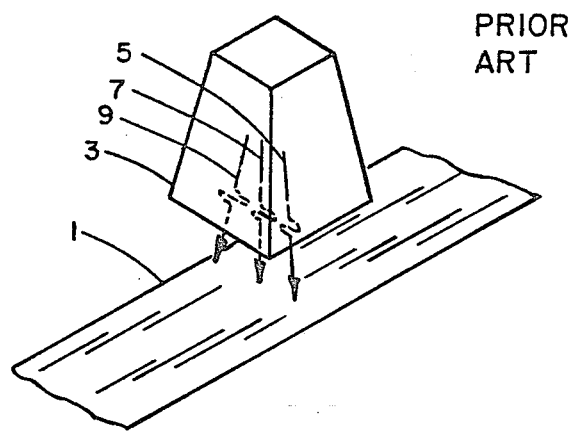
FIG. 1 schematically illustrates film being irradiated by prior art techniques.

It has been found that film may be irradiated within a trough having disposed adjacent the edges thereof electron deflectors for the purpose of deflecting electrons toward the bottom of the trough and thus back toward the film edge. This invention may be more readily understood by referring to the various figures of drawing. FIG. 1 of the drawings illustrates a conventional prior art process for irradiating film. As is shown in FIG. 1, a section of a film 1 passes beneath an electron generator generally designated at 3. The electron paths are shown as the lines 5, 7 and 9. In the conventional technique the electrons pass through the sheet 1 and are absorbed or dissipated by the surrounding atmosphere. For reasons which are not totally understood this arrangement does not have the efficiency in the edge portion of the film as it has in the central portion of the film. This is perhaps attributal to the angle of the electrons as they impinge upon the edges of the film as well as the geometry of the film edge. Regardless of the reason, however, the prior art process produces a film which generally has a 20 to 50 percent lower dose in the edge portions than the body of the film.

Figure 2:
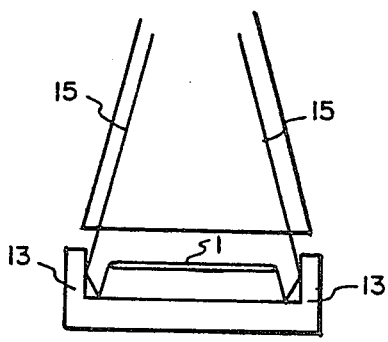
FIGS. 2 and 3 schematically illustrate film being irradiated by the technique of this invention.
Figure 3:
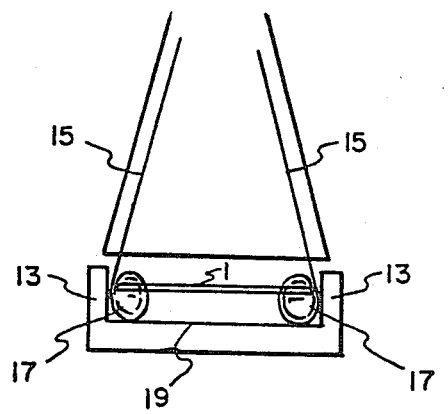

In accordance with this invention it has been found that if the film is irradiated within a trough, the film dosage is made substantially more uniform across the width of the film. FIG. 2 of the drawing illustrates the technique utilized in carrying out this invention. As is shown in FIG. 2 of the drawings, the trough in which the film 1 is irradiated possesses deflection boxes 13 which deflect the incident electron beam at the edges of the irradiation zone toward the bottom of the trough where the electrons are further deflected back toward the edge of the film The electron paths are illustrated by the lines 15 in FIG. 2. It is, of course, understood that this is not exactly the path that electrons follow but merely an exemplification for purposes of illustration of the function of this invention. The actual electron probability distribution as has been empirically determined from the utilization of the trough of this invention is schematically illustrated in FIG. 3 of the drawings. FIG. 3 of the drawings illustrates a lobe of high electron probability density which is substantially and desirably impinged by the edges of the film being irradiated. The lobes 17 are large enough such that film may actually be sinuously looped through the lobes so as to have more than one section of film irradiated by the back scattered electrons produced by the deflection boxes 13.

the location of the side boxes 13 with reference to the incident electron beam 15 is such as to produce an impingement upon the bottom 19 of the trough at an angle which is as close to a normal angle as is possible. By impinging at close to normal angle, the lobes 17 are produced. Utilizing electrons accelerated at a voltage of 500 KV., it has been found that ideally the deflection box 13 is located about 2 inches from the film edge and that the film edge be located 1 inch from the trough bottom 19. The deflection surface defined by trough bottom 19 need not be coextensive from one side of the trough to the other, but needs only to be extended beneath the edge to be irradiated by the back scattered electrons.

It is preferred that the angle between the deflection box 13 and trough bottom 19 be substantially normal. However, this angle may be deviated from so long as the electrons are deflected from the box to impinge upon the film edge after being deflected from the trough bottom 19.

Figure 4:
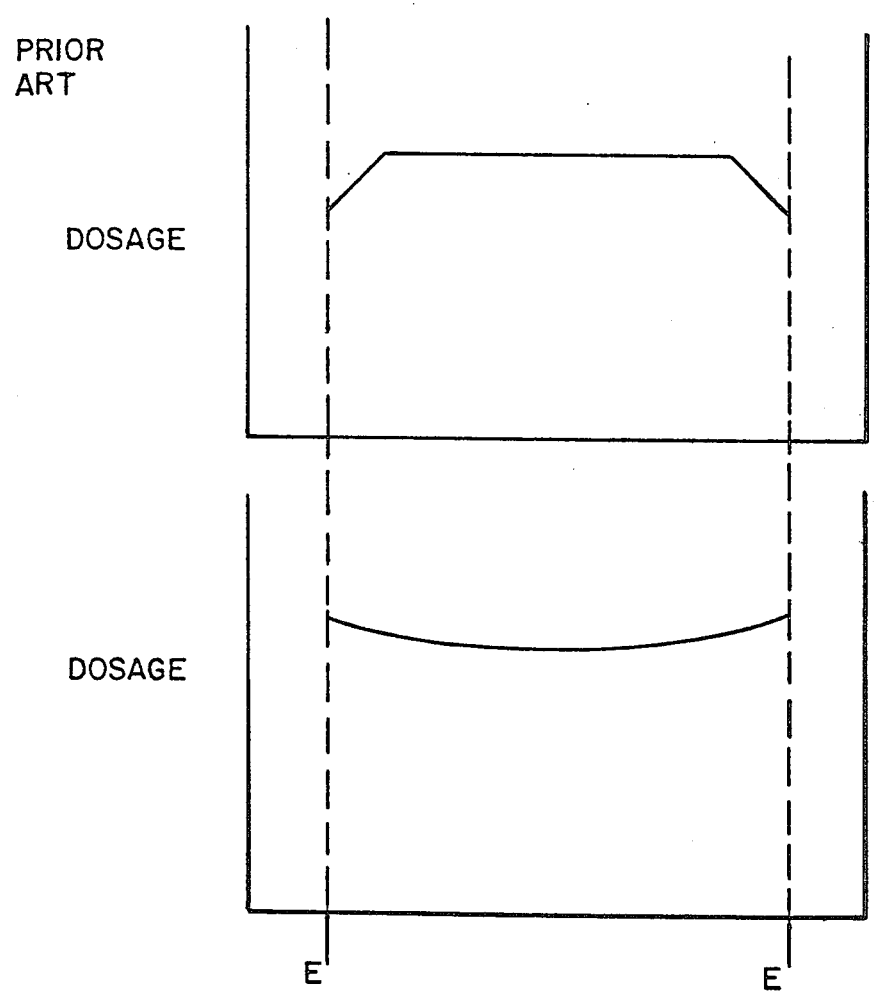
FIG. 4 is graphic profile representation of film dosages produced by both the prior art process and by the process of this invention.

FIG. 4 of the drawings illustrate the irradiation dosage profile produced both by the prior art technique and by the technique of this invention. As is observable in FIG. 4, the prior art technique produces substantially less dosage at the film edges marked by the lines E than in the central portion of the film. The lower part of FIG. 4 illustrates the dosage produced by utilizing the deflector box of this invention. By properly locating the deflector boxes the dosage profile can be made very close to a substantially flat line, i.e., uniform dosage across the width of the film. Utilizing the technique of this invention, irradiated film having a dosage which deviates from the mean dosage of the film by plus or minus 15 percent is produced. In contrast thereto, prior art techniques without the deflection blocks of this invention produce film which has a deviation across its width of from 30 to 50 percent of the mean dosage of the film section. It is thus seen that the technique of this invention produces irradiated film with a substantial improvement in the uniformity of dosage across a profile thereof. As an illustration of the uniformity produced utilizing the deflection technique of this invention, polyethylene tubing having a single wall thickness within the range of about 10 to 40 mils has been irradiated to a mean dosage of about 8 megarads with a deviation across the profile thereof of only 1 megarad. This represents a substantial and surprising improvement over the prior art processes which produce similar film having variations of up to 4 megarads across the profile.

The deflector blocks are of high molecular weight materials which are normally used for electron deflection purposes. Generally a material selected from tungsten, gold, lead or uranium may be utilized with equal efficiency. While low molecular weight materials may be utilized, the deflection efficiency is decreased with the lower molecular weight material.

Virtually any of the heretofore irradiated materials may be irradiated utilizing the technique of this invention. Most suitable for this invention are films which comprise polymers of ethylene as well as the other olefins. Particularly applicable to the process of this invention are copolymers of ethylene and vinyl acetate. The invention, however, is not limited to such materials and may be used on materials such as silicone rubber, ethylene propylene rubber and polyvinyl chloride. Generally the materials and dosages described in "Radiation Processing" by Thomas G. Mysiewicz, *Plastics Technology*, Vol. 23, No. 3, March 1977, may be utilized with this invention. This article is herewith incorporated by reference.

While this invention has been described generally with reference to the irradiation of film generally, its application is most advantageous when irradiating a flattened tubing of extruded material. A complete description of a process for extruding a cylindrical tube for irradiation by prior art techniques is described in U.S. Pat. No. 3,741,253. As is described therein, the cylindrical tube is flattened to form a tape for passage through an irradiation vault. The prior art problems of non-uniform dosage are magnified when such a tape is irradiated. The process of this invention, however, substantially eliminates the prior art problem associated with dosage non-uniformity. The process of this invention produces a tape as described above having a dosage profile which is within the range of plus or minus 15 percent of the mean dosage.

While the above description emphasizes particular aspects of this invention, various changes may be resorted to without departing from the spirit and scope of this invention as is defined by the following appended claims.

What is claimed is:

1. An apparatus adapted to irradiate a film of thermoplastic material comprising:
   source means for a beam of accelerated electrons; and
   trough means comprising trough bottom means and at least one deflection box means;
   wherein accelerated electrons directly impinge upon said deflection box means, are deflected to impinge upon said trough bottom means and are then further deflected;
   whereby a lobe of high electron probability density resulting from said deflections is adapted to impinge an edge of the film to be irradiated.

2. The improvement according to claim 1, wherein said deflection box means and said trough bottom means are at substantially normal angle.